United States Patent
Nakaoka

(10) Patent No.: US 10,665,316 B2
(45) Date of Patent: May 26, 2020

(54) MEMORY DEVICE

(71) Applicant: Winbond Electronics Corp., Taichung (TW)

(72) Inventor: Yuji Nakaoka, Kanagawa (JP)

(73) Assignee: Winbound Electronics Corp., Taichung (TW)

( * ) Notice: Subject to any disclaimer, the term of this patent is extended or adjusted under 35 U.S.C. 154(b) by 0 days.

(21) Appl. No.: 16/367,253

(22) Filed: Mar. 28, 2019

(65) Prior Publication Data

US 2019/0385692 A1    Dec. 19, 2019

(30) Foreign Application Priority Data

Jun. 15, 2018 (TW) .............................. 107120861 A

(51) Int. Cl.
| | | |
|---|---|---|
| *G11C 7/00* | (2006.01) | |
| *G11C 29/38* | (2006.01) | |
| *H03K 19/20* | (2006.01) | |

(52) U.S. Cl.
CPC .............. *G11C 29/38* (2013.01); *H03K 19/20* (2013.01)

(58) Field of Classification Search
CPC ... G11C 29/808; G11C 29/785; G11C 29/846; G11C 29/848; H05K 999/99
USPC .................................... 365/200, 189.05, 201
See application file for complete search history.

(56) References Cited

U.S. PATENT DOCUMENTS

| | | | |
|---|---|---|---|
| 6,067,262 A | 5/2000 | Irrinki et al. | |
| 6,928,377 B2 | 8/2005 | Eustis et al. | |
| 7,020,033 B2 * | 3/2006 | Nagata | G11C 29/44 365/200 |
| 9,361,196 B2 | 6/2016 | Kleveland et al. | |
| 2013/0173970 A1 | 7/2013 | Kleveland et al. | |

(Continued)

FOREIGN PATENT DOCUMENTS

| | | |
|---|---|---|
| CN | 102903393 | 4/2017 |
| JP | H0554692 | 3/1993 |

(Continued)

OTHER PUBLICATIONS

"Office Action of Japan Counterpart Application," dated Jun. 25, 2019, p. 1-p. 3.

(Continued)

*Primary Examiner* — Son T Dinh
(74) *Attorney, Agent, or Firm* — JCIPRNET

(57) ABSTRACT

A memory device is provided, including a built-in self-test circuit and a redundancy address replacement circuit. The built-in self-test circuit coupled to a main memory cell array is configured to performing a built-in self-test process on the main memory cell array so as to provide a built-in self-test signal. The redundancy address replacement circuit includes a first redundancy circuit and a second redundancy circuit. The first redundancy circuit replaces portion of word line addresses of the main memory cell array with that of a redundancy memory block according to first redundancy data signals generated by a first test process. The second redundancy circuit, coupled to the first redundancy circuit, replaces the failure word line addresses detected in the main memory cell array with another portion of word line addresses of the redundancy memory block according to the built-in self-test signal.

8 Claims, 7 Drawing Sheets

(56) References Cited

U.S. PATENT DOCUMENTS

2014/0078841 A1* 3/2014 Chopra .............. G11C 29/4401
365/200
2016/0259576 A1 9/2016 Asami et al.

FOREIGN PATENT DOCUMENTS

| | | |
|---|---|---|
| JP | H05151798 | 6/1993 |
| JP | 2004103165 | 4/2004 |
| JP | 2005149667 | 6/2005 |
| JP | 2006079695 | 3/2006 |
| JP | 2008084425 | 4/2008 |
| KR | 20010092411 | 10/2001 |
| TW | I252397 | 4/2006 |
| TW | 201546813 | 12/2015 |

OTHER PUBLICATIONS

"Office Action of Korea Counterpart Application," with English translation thereof, dated Aug. 14, 2019, p. 1-p. 7.

* cited by examiner

MEMORY DEVICE

CROSS-REFERENCE TO RELATED APPLICATION

This application claims the priority benefit of Taiwan application serial no. 107120861, filed on Jun. 15, 2018. The entirety of the above-mentioned patent application is hereby incorporated by reference herein and made a part of this specification.

BACKGROUND OF THE INVENTION

Field of the Invention

The disclosure relates to a semiconductor device, and particularly relates to a memory device having a built-in self-test (BIST) function.

Description of Related Art

With increasing circuit complexity, the manufacturing of various forms of memory devices are inevitably prone to produce poor or damaged memory elements. One of the common methods to improve the reliability of memory devices is to use an error-correcting code memory (ECC memory). However, using the memory of ECC technology is accompanied by problems of difficulty in shrinking sizes and increasing production costs.

SUMMARY OF THE INVENTION

The disclosure provides a memory device having a built-in self-test function which can perform a built-in self-test process after powering on and loading redundancy data of an eFuse, and replaces bad word line addresses detected in the built-in self-test process, in order to strengthen the reliability of the memory device.

A redundancy address replacement circuit of a memory device of the disclosure includes a first redundancy circuit and a second redundancy circuit, respectively applicable for replacing bad word line addresses detected by a first test process and a build-in self-test process with word line addresses of a redundancy memory block, wherein the first redundancy circuit also decides whether to perform replacement of portion of word line addresses according to a built-in self-test redundancy disable signal provided by the second redundancy circuit.

To make the aforementioned more comprehensible, several embodiments accompanied with drawings are described in detail as follows.

DETAILED DESCRIPTION OF DISCLOSED EMBODIMENTS

Figure 1:
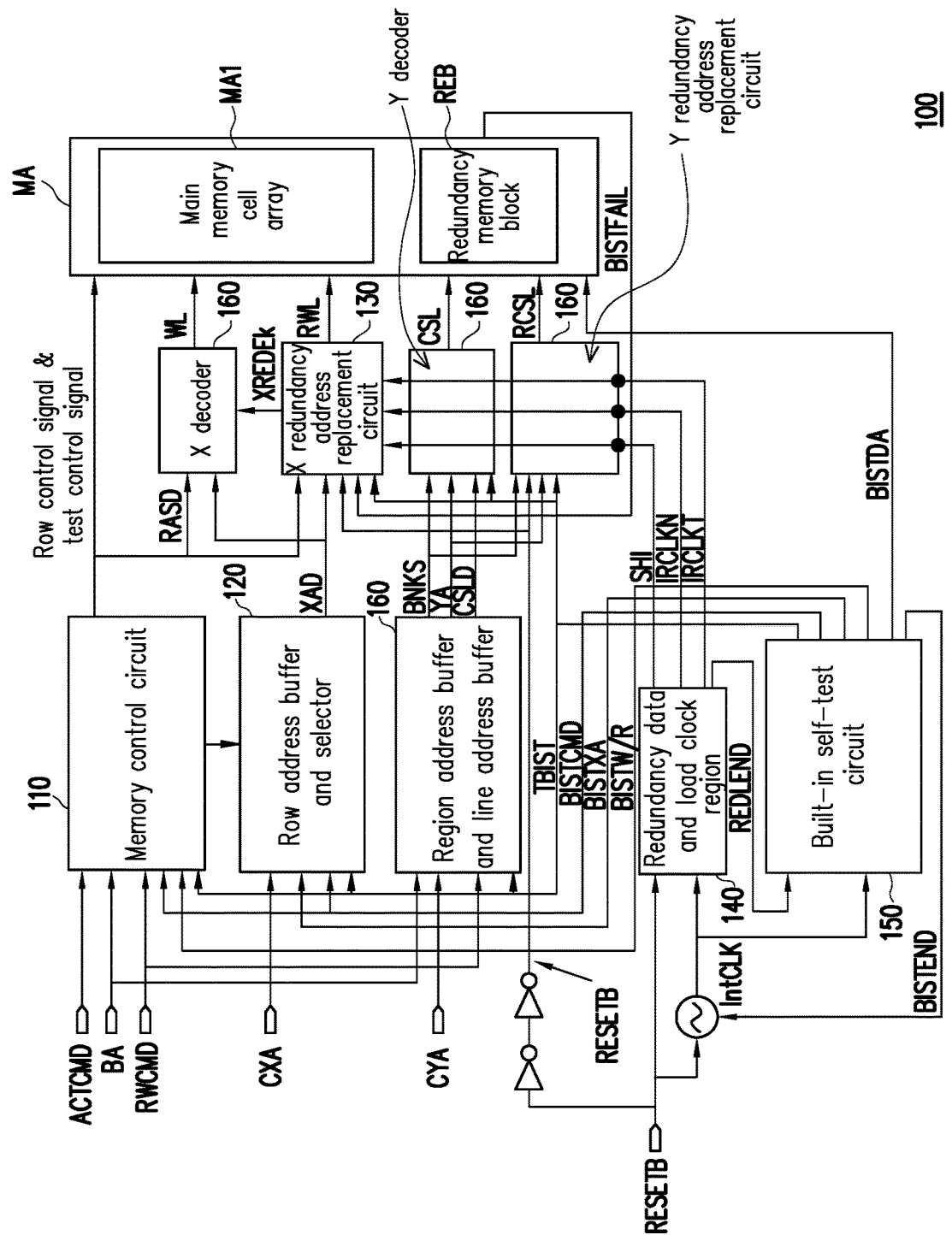
FIG. 1 shows a schematic diagram of a memory device of an exemplary embodiment of the disclosure.

Referring to FIG. 1, FIG. 1 shows a schematic diagram of a memory device of an exemplary embodiment of the disclosure. A memory device 100 has a memory cell array MA, a memory control circuit 110, a row address buffer and selector 120, an X redundancy address replacement circuit 130, a redundancy data and load clock region 140, a built-in self-test circuit 150 and a peripheral circuit 160 (for example, including a region address buffer and a line address buffer, an X decoder, a Y decoder, and a Y redundancy address replacement circuit.

The memory cell array MA includes a main memory cell array MA1 and a redundancy memory block REB, and redundancy memory rows and redundancy memory columns configured within the redundancy memory block REB. The redundancy memory rows and the redundancy memory columns have preparatory memory cells which can replace bad or damaged memory cells in the main memory cell array MA1 on the circuit. For example, a non-volatile memory redundancy address is switched by an eFuse element to maintain normal functions of the memory device 100.

In FIG. 1, the memory device 100 is, for example, a wafer type dynamic random access memory (DRAM) or a static random access memory (SRAM) or other similar devices or a combination of the foregoing devices. The redundancy data and load clock region 140 can record redundancy data generated by the first test process, for example, a one-time programming non-volatile memory. The first test process herein can be, for example, a wafer prober process, and is not limited in the disclosure.

In the exemplary embodiment, after an electronic device equipped with the memory device 100 is powered on, the redundancy data and the load clock region 140 can provide first redundancy data signals generated by the first test process, including, for example, a serial eFuse data input signal SHI, an eFuse data internal clock signal IRCLKT and an eFuse data internal inverted clock signal IRCLKN thereof. The redundancy address replacement circuit (including the X redundancy address replacement circuit 130 and the Y redundancy address replacement circuit 160) can replace addresses of bad memory cells obtained by the main memory cell array MA1 detected by the first test process, with the memory cell addresses of the redundancy memory block REB according to the first redundancy data signals.

Next, after replacing the addresses of the bad memory cells with the redundancy memory cell addresses according to the first redundancy data signals, the system can continue to perform a built-in self-test process to check whether there are other bad memory cells.

The built-in self-test circuit 150 of the memory device 100 coupled to the memory cell array MA, can perform the built-in self-test process on the main memory cell array MA1. The built-in self-test circuit 150 receives a clock signal IntCLK and provides a built-in self-test signal BIST-FAIL indicating a PASS or a FAIL. The X redundancy address replacement circuit 130 can replace failure word line addresses detected in the main memory cell array MA1 with another portion of word line addresses of the redundancy memory block REB according to the built-in self-test signal BISTFAIL.

In short, the memory device 100 of the exemplary embodiment can replace the corresponding addresses of bad or damaged memory cells in the main memory cell array MA1 with the memory cell addresses of the redundancy memory block REB by the first redundancy data signals of the first test process, and can also replace memory cells in the first test process that are detected as normal but damaged in the future with memory cells of the redundancy memory block REB by performing the built-in self-test process after powering on, thereby improving the reliability of the memory device 100.

The implementation method of the disclosure will be further described below in conjunction with other exemplary embodiments. Circuit structures of FIG. 2 to FIG. 6 can be applied to the memory device 100 of FIG. 1. The waveform action diagram of FIG. 7 can be applied to the circuits of FIG. 1 to FIG. 6.

Figure 2:
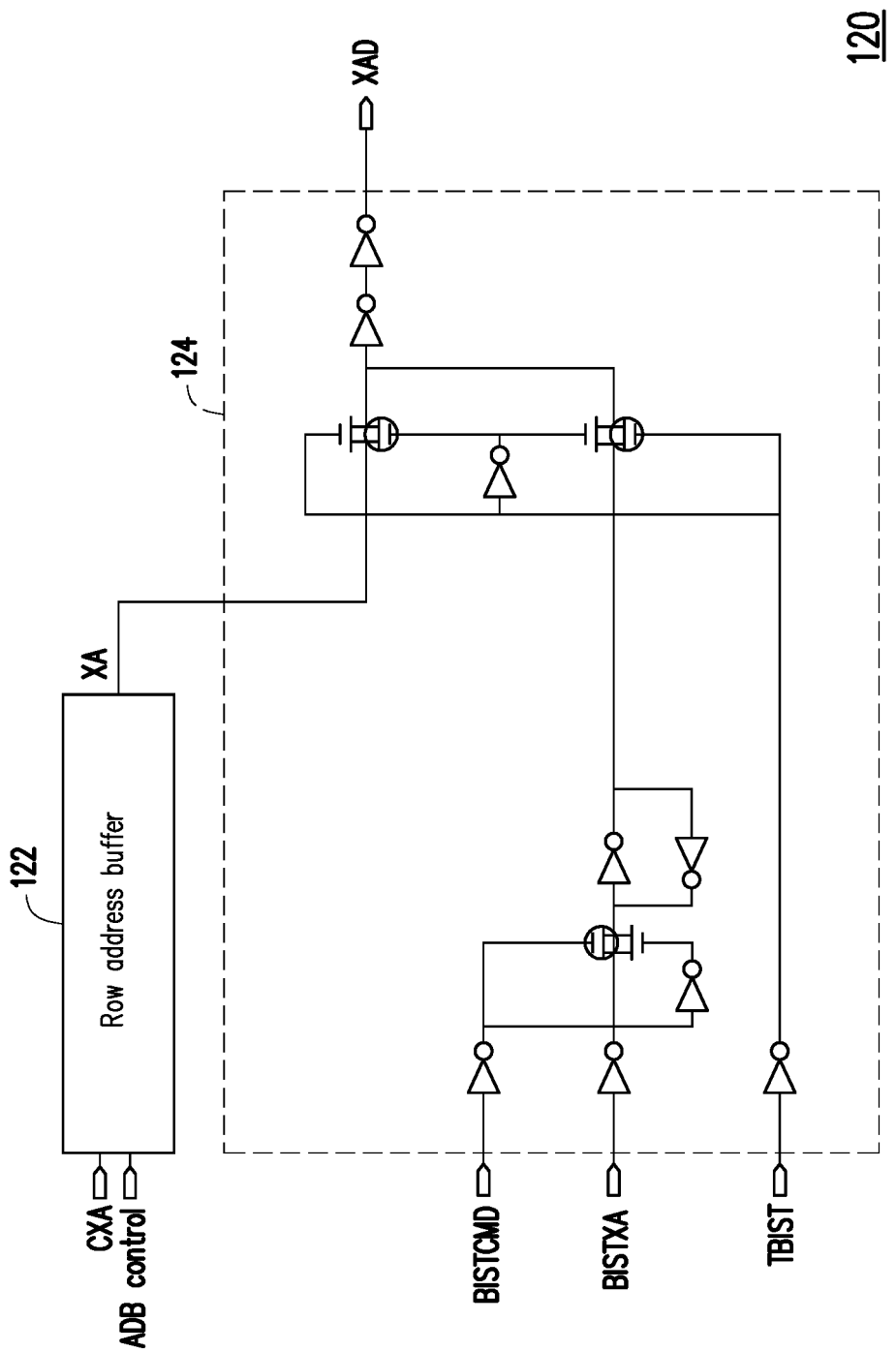
FIG. 2 shows a schematic diagram of a row address buffer and selector of an exemplary embodiment of the disclosure.

FIG. 2 shows a schematic diagram of a row address buffer and selector of an exemplary embodiment of the disclosure. Referring to FIG. 1 with reference to FIG. 2, in the exemplary embodiment, the row address buffer and selector 120 has a row address buffer 122 and a row address selector 124. The circuit structure of the row address selector 124 in FIG. 2 is an example, and the disclosure does not limit the circuit structures of the row address buffer 122 and the row address selector 124, which can be appropriately designed by people skilled in the art.

The row address buffer 122 receives a word line address CXA for access from a mode resister (not shown), and the row address selector 124 is used in different modes, for example, an access mode or a built-in self-test mode, to select the word line address to input. For example, when in the built-in self-test mode, a built-in self-test word line address BISTXA may be input to the selected X redundancy address replacement circuit 130.

Figure 3:
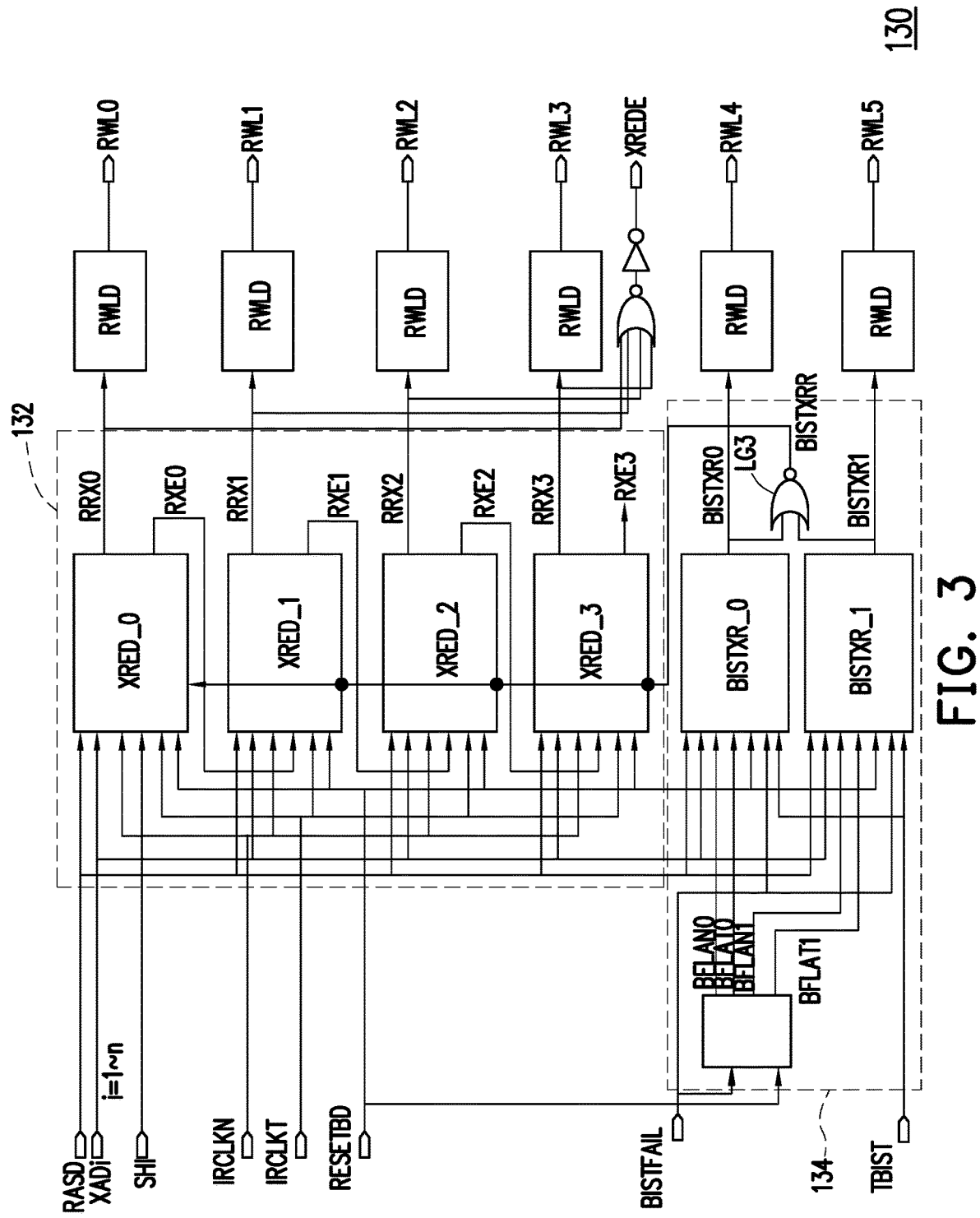
FIG. 3 shows a schematic diagram of a redundancy address replacement circuit of an exemplary embodiment of the disclosure.

FIG. 3 shows a schematic diagram of a redundancy address replacement circuit of an exemplary embodiment of the disclosure. Continuing to refer to FIG. 1 with reference to FIG. 3, the redundancy address replacement circuit in FIG. 3 is applicable to the X redundancy address replacement circuit 130 of FIG. 1, which includes a first redundancy circuit 132 and a second redundancy circuit 134 coupled to the first redundancy circuit 132. The first redundancy circuit 132 can replace portion of word line addresses (that is, row addresses) of the main memory cell array MA1 with portion of word line addresses of the redundancy memory block REB according to the first redundancy data signals. The second redundancy circuit 134 replaces failure word line addresses detected in the main memory cell array MA1 with another portion of word line addresses of the redundancy memory block REB according to the built-in self-test signal BISTFAIL. The first redundancy circuit 132 includes a plurality of first redundancy address replacement circuits, and the second redundancy circuit 134 includes a plurality of second redundancy address replacement circuits.

Figure 7:
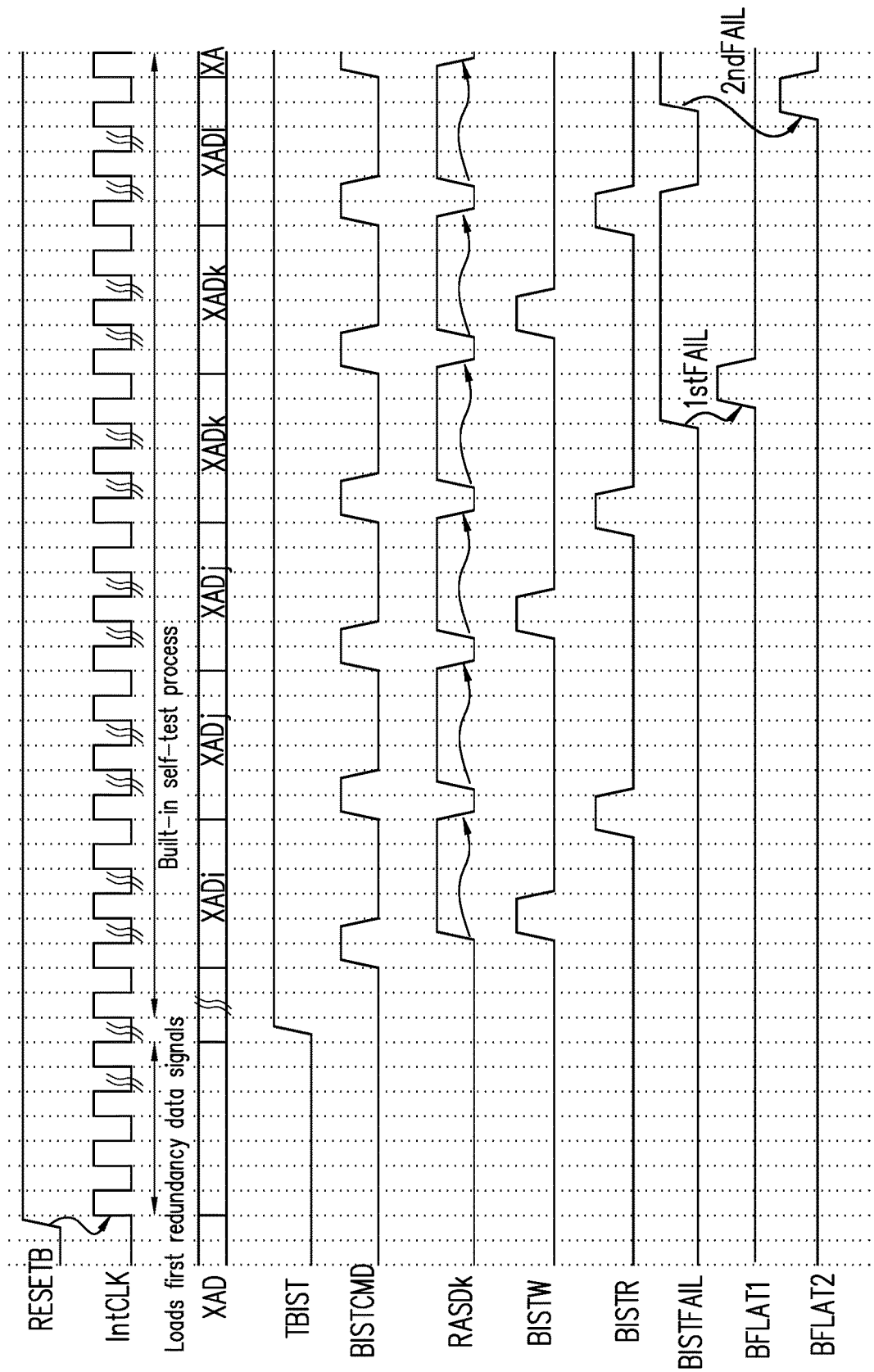
FIG. 7 shows a waveform action diagram of a built-in self-test process of an exemplary embodiment of the disclosure.

FIG. 7 shows a waveform action diagram of a built-in self-test process of an exemplary embodiment of the disclosure. In FIG. 7, the built-in self-test process detects that memory cells on two bit lines have an abnormality, as represented by a logic level of the built-in self-test signal BISTFAIL changing from a low level to a high level. Therefore, in the exemplary embodiment, processing bad word line addresses of the first redundancy data signals with four of first redundancy address replacement circuits XRED_0 to XRED_3, and processing two bad word line addresses discovered by the built-in self-test signal BISTFAIL with two of second redundancy address replacement circuits BISTXR_0 and BISTXR_1, serve as examples but are not limited.

To be specific, the second redundancy circuit 134 further includes a built-in self-test address latch circuit BFLAT and a logic gate LG3. The built-in self-test address latch circuit BFLAT receives the built-in self-test signal BISTFAIL and generates a built-in self-test address latch signal BFLATm and an inverted signal BFLANm (m=0 or 1) thereof, to be supplied separately to the second redundancy address replacement circuits BISTXR_0 and BISTXR_1.

The logic gate LG3 coupled to the aforementioned second redundancy address replacement circuits BISTXR_0 and BISTXR_1, respectively receives second redundancy address selection signals BISTXR0 and BISTXR1, and outputs a built-in self-test redundancy disable signal BISTXRR. In the exemplary embodiment, the logic gate LG3 uses a NOR gate as an example, and high and low level states of the built-in self-test redundancy disable signal BISTXRR can indicate whether bad memory cells are discovered in the built-in self-test process, and whether replacement word lines are needed.

The first redundancy address replacement circuits XRED_0 to XRED_3 in the first redundancy circuit 132 also receive the built-in self-test redundancy disable signal BISTXRR in addition to receiving the first redundancy data signals, and base on the built-in self-test redundancy disable signal BISTXRR and the first redundancy data signals, determine whether portion of word line addresses in the main memory cell array MA1 are to be disabled, and output a first redundancy address selection signal RRXj (j=0~3), to a corresponding redundancy word line replacement circuit RWLD. The redundancy word line replacement circuit RWLD replaces portion of bad word line addresses in the main memory cell array MA1 with portion of word line addresses of the redundancy memory block REB according to the first redundancy address selection signal RRXj. For example, a redundancy memory block word line RWLq, where q=0~3 herein.

In other words, when the built-in self-test process does not discover the word line addresses that need to be replaced, the first redundancy circuit 132 disables the bad memory cells in the main memory cell array MA1 according to the first redundancy data signals, and is replaced by the memory cells in the redundancy memory block REB. When the built-in self-test process discovers that other bad memory cells are still encountered during an access process after word line addresses of the first redundancy data signals are replaced, two areas of the BISTFAIL of FIG. 7 change to a high level state, such as 1stFAIL and 2ndFAIL, indicating that a detection access has failed. The first redundancy circuit 132 can determine whether to replace portion of word line addresses of the main memory cell array MA1 with portion of word line addresses of the redundancy memory block REB, according to the built-in self-test redundancy disable signal BISTXRR and the first redundancy data signals.

Figure 4:
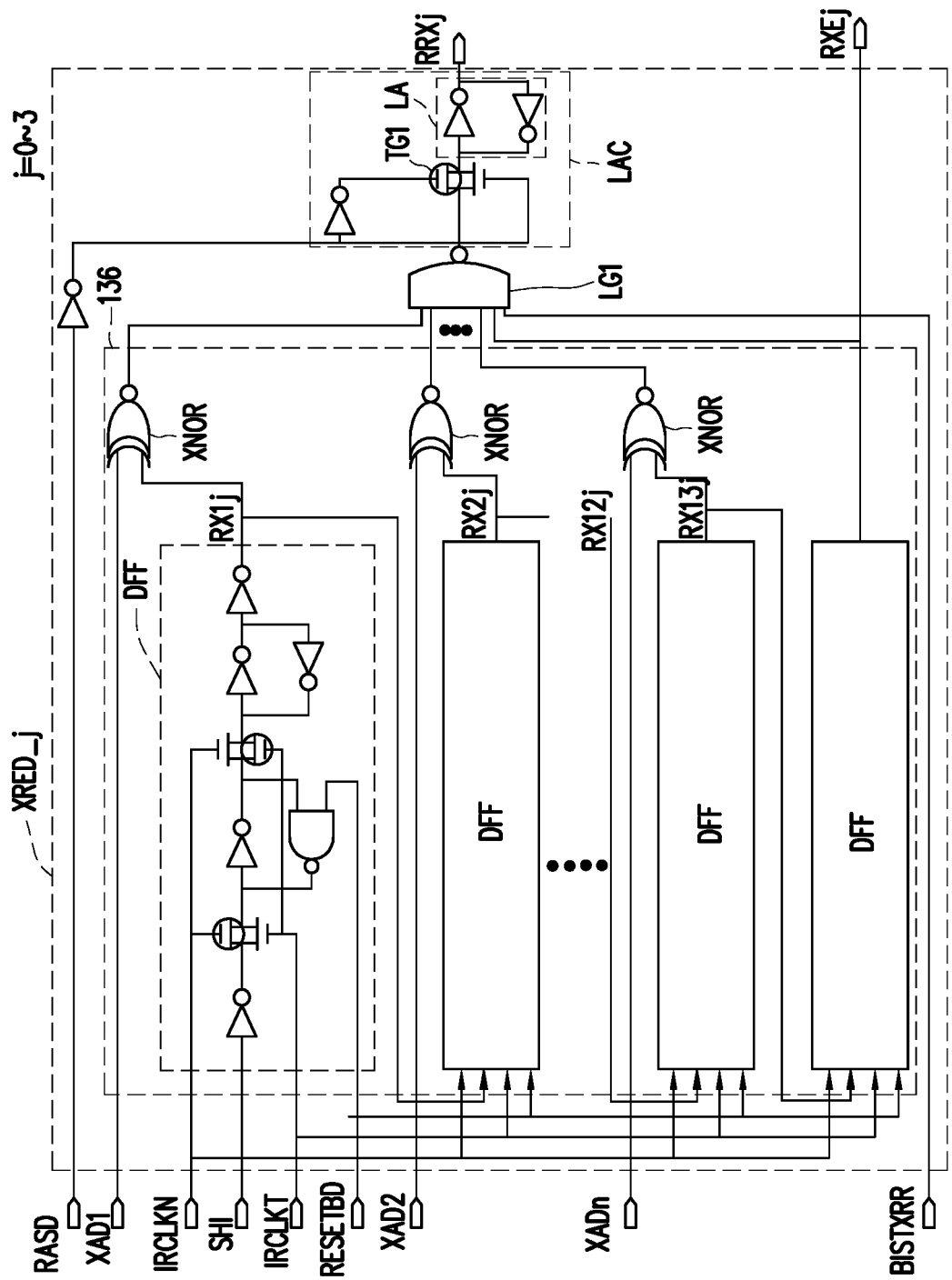
FIG. 4 shows a schematic diagram of a first redundancy address replacement circuit of an exemplary embodiment of the disclosure.

FIG. 4 shows a schematic diagram of a first redundancy address replacement circuit of an exemplary embodiment of the disclosure. Further referring to FIG. 4, a first redundancy address replacement circuit XRED_j (j=0~3) includes a first redundancy address determining circuit 136, a first logic gate LG1, and a latch circuit LAC. The first redundancy address determining circuit 136 receives first redundancy data signals (for example, a serial eFuse data input signal SHI, an eFuse data internal clock signal IRCLKT and an inverted signal IRCLKN thereof), and determines whether the word line addresses of the main memory cell array MA1 are to be replaced according to the first redundancy data signals.

Specifically, the first redundancy address determining circuit 136 includes a plurality of flip-flops DFF connected in series and a plurality of XNOR gates, and numbers of the flip-flops DFF and the XNOR gates are related to a number of word lines of the main memory cell array MA1. In the exemplary embodiment, the main memory cell array MA1 has n of the word lines, and the first redundancy address determining circuit 136 has n of the XNOR gates and n+1 of the flip-flops DFF as an example. A circuit structure of the flip-flops DFF may be referred to FIG. 4, but is not limited thereto.

A clock input end of the flip-flops DFF receives the eFuse data internal clock signal IRCLKT and the inverted signal IRCLKN thereof in the first redundancy data signals, wherein an input end of a first flip-flop DFF receives a serial eFuse data input signal SHI in the first redundancy data signals. Output ends of the foregoing n of flip-flops DFF are respectively coupled to an input end of the XNOR gate, another input end of the XNOR gate receives a word line address XADi (i=1~n) of the main memory cell array MAL the XNOR gate can be compared to output signals of the word line address XADi and the flip-flop DFF to determine whether the word line address XADi has a bad memory cell, wherein the output end is coupled to an input end of the first logic gate LG1. An output end of n+1 of the flip-flop DFF is directly coupled to an input end of the first logic gate LG1.

The first logic gate LG1 receives an output signal of the first redundancy address determining circuit 136 and the built-in self-test redundancy disable signal BISTXRR from the second redundancy circuit 134 to generate an output signal. A latch circuit LAC is coupled to the first logic gate LG1 to latch the output signal of the first logic gate LG1.

Furthermore, the latch circuit LAC can include a transmission gate TG1 and a latch LA. The transmission gate TG1 is coupled between an output end of the first logic gate LG1 and the latch LA, and is controlled by a row active signal (RASD). The latch LA receives the output signal of the first logic gate LG1 by the transmission gate TG1 and outputs the first redundancy address selection signal RRXj to the redundancy word line replacement circuit RWLD to carry out a replacement action.

Figure 5:
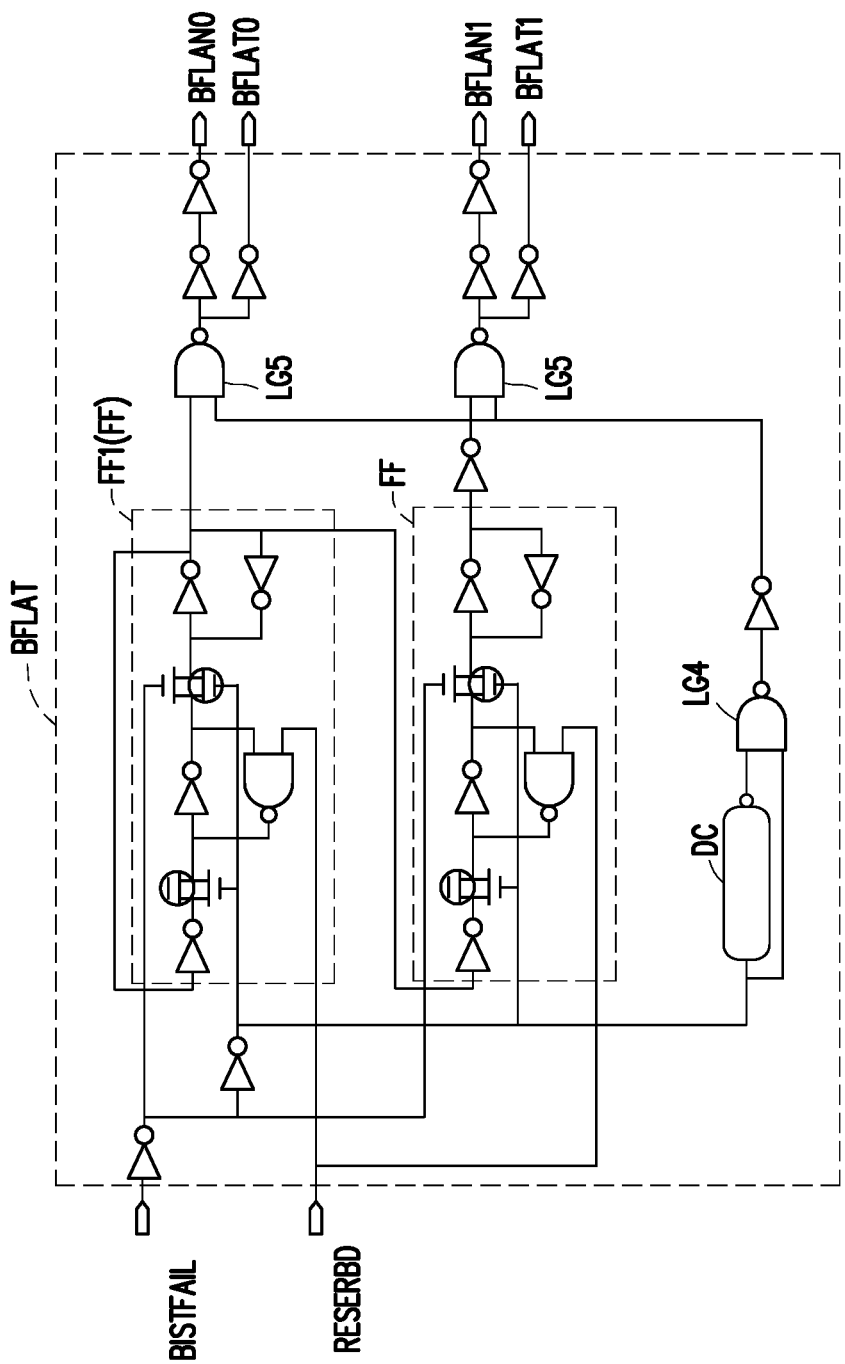
FIG. 5 shows a schematic diagram of a built-in self-test address latch circuit of an exemplary embodiment of the disclosure.

In addition, FIG. 5 shows a schematic diagram of a built-in self-test address latch circuit of an exemplary embodiment of the disclosure. Referring to FIG. 3 with reference to FIG. 5, the built-in self-test address latch circuit BFLAT includes a plurality of first flip-flop circuits FF connected in series, a delay circuit DC, a fourth logic gate LG4, and a plurality of fifth logic gates LG5. The fourth logic gate LG4 and the plurality of fifth logic gates LG5 are, for example, NAND gates.

Numbers of the first flip-flop circuit FF and the fifth logic gates LG5 correspond to numbers of second redundancy address replacement circuits BISTXR_m, where m is an integer herein. For example, the exemplary embodiment has two of the second redundancy address replacement circuits, BISTXR_0 and BISTXR_1, so the first flip-flop circuit FF and the fifth logic gate LG5 are also two. A circuit structure of the first flip-flop circuit FF can be referred to FIG. 5, which is similar to the flip-flop DFF of FIG. 4, but the disclosure is not limited thereto.

Clock input ends of the first flip-flop circuits FF receive the built-in self-test signals BISTFAIL, and output ends are coupled to input ends of the fifth logic gates LG5. The first flip-flop circuits FF are connected to each other in series, wherein a first of the first flip-flop circuit FF, such as a first flip-flop circuit FF1 at very top of FIG. 5, has an output signal fed back to an input end thereof.

One input end of the fifth logic gates LG5 receives an output signal of the corresponding first flip-flop circuit FF, another input end receives an output signal of the fourth logic gate LG4, wherein one input end of the fourth logic gate LG4 receives the built-in self-test signal BISTFAIL, and another input end receives the built-in self-test signal BISTFAIL delayed by the delay circuit DC. The output end of the fifth logic gate LG5 outputs a built-in self-test address latch signal BFLATm and an inverted signal BFLANm thereof to a corresponding second redundancy address replacement circuit BISTXR_m, where m=0 or 1 herein.

Figure 6:
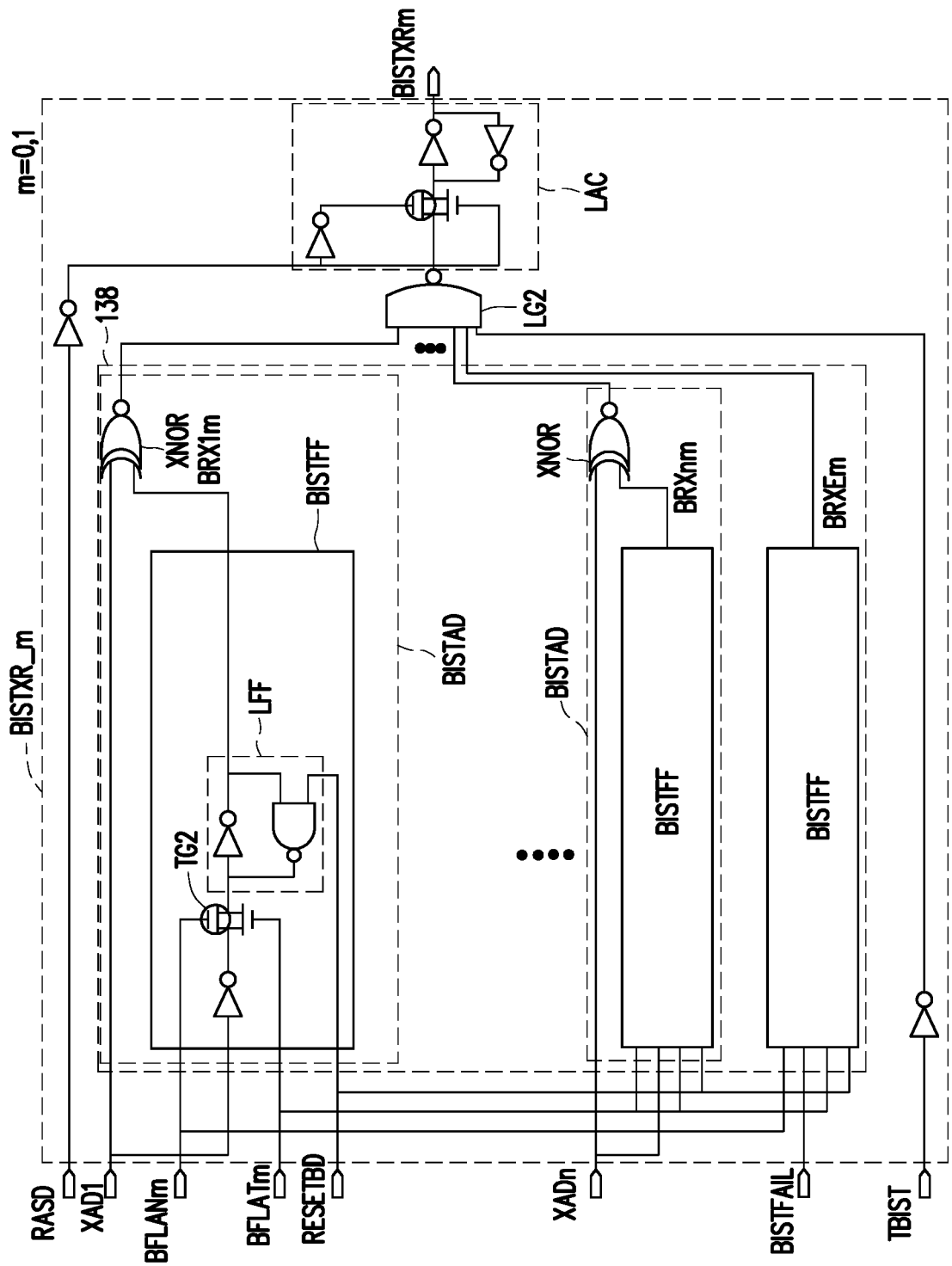
FIG. 6 shows a schematic diagram of a second redundancy address replacement circuit of an exemplary embodiment of the disclosure.

FIG. 6 shows a schematic diagram of a second redundancy address replacement circuit of an exemplary embodiment of the disclosure. Referring to FIG. 3 with reference to FIG. 6, the second redundancy address replacement circuit BISTXR_m includes a second redundancy address determining circuit 138, a second logic gate LG2, and another latch circuit LAC. The second redundancy address determining circuit 138 is configured to determine whether there are still word line addresses that need to be replaced in the main memory cell array MAL including a plurality of parallel built-in self-test address determining circuits BISTAD and a second flip-flop circuit BISTFF, wherein each of the built-in self-test address determining circuit BISTAD includes an additional second flip-flop circuit BISTFF and a sixth logic gate, where the sixth logic gate is, for example, an XNOR gate herein.

Numbers of the second flip-flop circuits BISTFF and the XNOR gates are related to number of word lines of the main memory cell array MA1. In the exemplary embodiment, when the main memory cell array MA1 has n of the word lines, the second redundancy address determining circuit 138 includes n of the built-in self-test address determining circuits BISTAD, that is, there are a total of n of the XNOR gates and n+1 of the second flip-flop circuits BISTFF.

The clock input ends of the second flip-flop circuits BISTFF receive the corresponding built-in self-test address latch signal BFLATm and the inverted signal BFLANm (m=0 or 1) thereof from the built-in self-test address latch circuit BFLAT, wherein the input end of the second flip-flop circuit BISTFF in the built-in self-test address determining circuit BISTAD receives the corresponding word line address XADi (i=1~n), and the output end is coupled to the input end of the XNOR gate, wherein another input end of the XNOR gate receives the corresponding word line address XADi. The XNOR gate compares the output signals of the word line address XADi and the second flip-flop circuit BISTFF to determine whether the word line address XADi has bad memory cells. The output end of the XNOR gate is coupled to the second logic gate LG2.

More specifically, the second flip-flop circuit BISTFF of the exemplary embodiment includes a transmission gate TG2 and a flip-flop LFF. The transmission gate TG2 is controlled by the corresponding built-in self-test address latch signal BFLATm and the inverted signal BFLANm thereof, wherein the transmission gate TG2 in the built-in self-test address determining circuit BISTAD receives the word line address XADi to be detected, and the flip-flop LFF in the built-in self-test address determining circuit BISTAD receives the word line address XADi to be detected through the transmission gate TG2, and the output end of the flip-flop LFF is coupled to the XNOR gate. The transmission gate TG2 of the second flip-flop circuit BISTFF outside the built-in self-test address determining circuit BISTAD receives the built-in self-test signal BISTFAIL, the corresponding flip-flop LFF receives the built-in self-test signal BISTFAIL by the transmission gate TG2, where the output end is directly coupled to the second logic gate LG2.

The input end of the second flip-flop circuit BISTFF outside the built-in self-test address determining circuit BISTAD receives the built-in self-test signal BISTFAIL, and the output end is directly coupled to the second logic gate LG2. An output signal of the second flip-flop circuit BISTFF herein is BRXEm, and the logic level can indicate whether addresses of the bad memory cells are replaced. For example, the output signal BRXEm when in a high level state represents, that bad memory cells discovered during a self-detection process need to be replaced. On the contrary, the output signal BRXEm when in a low level state, represents that no new bad memory cells are detected.

The second logic gate LG2 receives the output signal of the second redundancy address determining circuit 138 and a built-in self-test mode signal TBIST sent out from the built-in self-test circuit 150. The latch circuit LAC is coupled to the second logic gate LG2 to latch the output signal of the second logic gate LG2, and outputs the second redundancy address selection signal BISTXRm to the redundancy word line replacement circuit RWLD for carrying out a replacement action. The redundancy word line replacement circuit RWLD replaces the bad word line addresses with the word line addresses of the redundancy memory block REB according to the second redundancy address selection signal BISTXRm. For example, one of redundancy memory block word lines RWLqk, where q=4~5 as an example.

In short, the second redundancy address replacement circuit BISTXR_m is used to determine whether the word line addresses in the main memory cell array MA1 need to be replaced according to the built-in self-test signal BISTFAIL, and outputs a determination result of the second redundancy address selection signal BISTXRm to the redundancy word line replacement circuit RWLD.

In summary of the foregoing, the memory device of the disclosure can carry out repair actions corresponding to a plurality of detection process. The first test process is first executed to obtain the first redundancy data signal. After powering on and loading the first redundancy data signal, the memory device can execute a built-in self-test process to obtain a built-in self-test signal. The second redundancy circuit can replace the failure word line addresses detected in the main memory cell array with another portion of the word line addresses of the redundancy memory block according to the built-in self-test signal. The first redundancy circuit can generate a built-in self-test redundancy disable signal to disable the bad memory cells in the main memory cell array according to the first redundancy data signal and the second redundancy circuit. Therefore, the reliability of the memory device can be improved.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A memory device comprising:
a built-in self-test circuit coupled to a main memory cell array, configured to perform a built-in self-test process on the main memory cell array to provide a built-in self-test signal; and
a redundancy address replacement circuit comprising:
a first redundancy circuit replacing portion of word line addresses of the main memory cell array with portion of word line addresses of a redundancy memory block according to first redundancy data signals generated by a first test process; and
a second redundancy circuit coupled to the first redundancy circuit, replacing failure word line addresses detected in the main memory cell array with another portion of word line addresses of the redundancy memory block according to the built-in self-test signal.

2. The memory device according to claim 1, wherein the second redundancy circuit generates a built-in self-test redundancy disable signal, and the first redundancy circuit determines whether to replace portion of word line addresses of the main memory cell array with portion of word line addresses of the redundancy memory block according to the built-in self-test redundancy disable signal.

3. The memory device according to claim 2, wherein the first redundancy circuit comprises a plurality of first redundancy address replacement circuits, wherein each of the first redundancy address replacement circuit comprises:
a first redundancy address determining circuit configured to determine whether word line addresses of the main memory cell array are to be replaced according to the first redundancy data signals;
a first logic gate coupled to the first redundancy address determining circuit, receiving output signals of the first redundancy address determining circuit and the built-in self-test redundancy disable signal; and
a first latch circuit coupled to the first logic gate, configured to latch output signals of the first logic gate, and output a first redundancy address selection signal,
wherein the redundancy address replacement circuit replaces portion of word line addresses of the main memory cell array with portion of word line addresses of the redundancy memory block according to the first redundancy address selection signal.

4. The memory device according to claim 3, wherein the first latch circuit comprises:
a first transmission gate coupled to the first logic gate, and controlled by a row active signal; and
a first latch receiving output signals of the first logic gate through the first transmission gate and outputting the first redundancy address selection signal.

5. The memory device according to claim 2, wherein the second redundancy circuit comprises:
a plurality of second redundancy address replacement circuits, and each of the second redundancy address replacement circuit comprises:
a second redundancy address determining circuit configured to determine whether word line addresses of the main memory cell array are to be replaced;
a second logic gate coupled to the second redundancy address determining circuit, receiving output signals of the second redundancy address determining circuit and a built-in self-test mode signal; and a second latch circuit coupled to the second logic gate, configured to latch output signals of the second logic gate, and outputs a second redundancy address selection signal; and a third logic gate coupled to the plurality of second redundancy address replacement circuits, to receive the plurality of second redundancy address selection signals, and outputs the built-in self-test redundancy disable signal, wherein the redundancy address replacement circuit replaces portion of word line addresses of the main memory cell array with portion of word line addresses of the redundancy memory block according to the second redundancy address selection signal.

6. The memory device according to claim 5, wherein the second redundancy circuit further comprises:

a plurality of first flip-flop circuits corresponding to the plurality of second redundancy address replacement circuits, the plurality of first flip-flop circuits are connected in series and clock input ends thereof all receive the built-in self-test signals, wherein output signals of the first flip-flop circuit in the plurality of first flip-flop circuits are fed back to input ends thereof;

a fourth logic gate, wherein one end receives the built-in self-test signal, and another end receives the built-in self-test signal after delay; and a plurality of fifth logic gates, respectively coupled to the plurality of first flip-flop circuits and the fourth logic gate, wherein each of the fifth logic gate receives corresponding output signals of the first flip-flop circuit and output signals of the fourth logic gate, and outputs built-in self-test address latch signals to the corresponding second redundancy address replacement circuits.

7. The memory device according to claim 6, wherein the second redundancy address determining circuit comprises:

a plurality of built-in self-test address determining circuits, the plurality of build-in self-test address determining circuits are connected in parallel, wherein each of the build-in self-test address determining circuit comprises:

a second flip-flop circuit where clock input ends thereof receive corresponding build-in self-test address latch signals, where input ends thereof receive word line addresses to be detected; and a sixth logic gate receiving output signals of the second flip-flop circuit and the word line addresses to be detected, where output signals of output ends thereof are fed to the second logic gate; and another second flip-flip circuit connected in parallel with the plurality of built-in self-test address determining circuits, where clock input ends thereof receive corresponding built-in self-test address latch signals, where input ends thereof receive the build-in self-test signals, where output ends thereof are coupled to the second logic gate.

8. The memory device according to claim 7, wherein the second flip-flop circuit comprises:

a second transmission gate receiving word line address to be detected or the built-in self-test signals, and controlled by the corresponding built-in self-test address latch signals; and a flip-flop receiving the word line addresses to be detected or the built-in self-test signals by the second transmission gate, where an output end thereof is coupled to the sixth logic gate or the second logic gate.

* * * * *

UNITED STATES PATENT AND TRADEMARK OFFICE
CERTIFICATE OF CORRECTION

PATENT NO. : 10,665,316 B2
APPLICATION NO. : 16/367253
DATED : May 26, 2020
INVENTOR(S) : Yuji Nakaoka It is certified that error appears in the above-identified patent and that said Letters Patent is hereby corrected as shown below:

On the Title Page

Item (73) Assignee should read: Winbond Electronics Corp., Taichung City, (TW)

Signed and Sealed this
Twenty-fifth Day of August, 2020

Andrei Iancu
*Director of the United States Patent and Trademark Office*